US012219881B2

(12) United States Patent
Dutta et al.

(10) Patent No.: US 12,219,881 B2
(45) Date of Patent: Feb. 4, 2025

(54) DUAL LAYER TOP CONTACT FOR MAGNETIC TUNNEL JUNCTION STACK

(71) Applicant: International Business Machines Corporation, Armonk, NY (US)

(72) Inventors: Ashim Dutta, Clifton Park, NY (US); Chih-Chao Yang, Glenmont, NY (US)

(73) Assignee: International Business Machines Corporation, Armonk, NY (US)

( * ) Notice: Subject to any disclaimer, the term of this patent is extended or adjusted under 35 U.S.C. 154(b) by 604 days.

(21) Appl. No.: 17/485,453

(22) Filed: Sep. 26, 2021

(65) Prior Publication Data

US 2023/0098576 A1    Mar. 30, 2023

(51) Int. Cl.
| | | |
|---|---|---|
| *H01L 43/08* | (2006.01) | |
| *H01L 27/22* | (2006.01) | |
| *H01L 43/02* | (2006.01) | |
| *H10B 61/00* | (2023.01) | |
| *H10N 50/10* | (2023.01) | |
| *H10N 50/80* | (2023.01) | |

(52) U.S. Cl.
CPC ............ *H10N 50/10* (2023.02); *H10B 61/20* (2023.02); *H10N 50/80* (2023.02)

(58) Field of Classification Search
CPC ........ H10N 50/01; H10N 50/80; H10N 50/10; G11C 11/161; G11C 2211/5615; H10B 61/00; H10B 61/20; G01R 33/098; G11B 5/3909

See application file for complete search history.

(56) References Cited

U.S. PATENT DOCUMENTS

| | | | |
|---|---|---|---|
| 7,442,647 B1 | 10/2008 | Kanakasabapathy | |
| 9,343,659 B1 | 5/2016 | Lu | |
| 10,454,021 B2 | 10/2019 | Sung | |
| 10,504,958 B2 | 12/2019 | Kalnitsky | |
| 2013/0119494 A1 | 5/2013 | Li | |
| 2016/0365505 A1 | 12/2016 | Lu | |
| 2019/0013354 A1 | 1/2019 | Lee | |
| 2019/0140018 A1* | 5/2019 | Kalnitsky | ............ G11C 11/161 |
| 2020/0066967 A1 | 2/2020 | Suri | |
| 2020/0098982 A1* | 3/2020 | Chuang | .................. H10B 61/22 |
| 2020/0144484 A1 | 5/2020 | Chen | |

OTHER PUBLICATIONS

IPCOM000263714D, "MRAM Top Contact Structure," Disclosed Anonymously, Sep. 29, 2020.
K. Garello, F. Yasin and G. S. Kar, "Spin-Orbit Torque MRAM for ultrafast embedded memories: from fundamentals to large scale technology integration," 2019 IEEE 11th International Memory Workshop (IMW), 2019, pp. 1-4, doi: 10.1109/IMW.2019.8739466.

* cited by examiner

*Primary Examiner* — Shahed Ahmed
*Assistant Examiner* — Rhys Poniente Sheker
(74) *Attorney, Agent, or Firm* — Matthew Zehrer

(57) ABSTRACT

A semiconductor device includes a dual layer top contact upon a MTJ stack. The dual layer top contact includes lower contact and upper contact. The lower contact may be wider and/or shallower relative to the upper contact. This wide and/or shallow geometry of the lower contact may decrease the propensity for over etching, during the formation of the upper contact, opening downward into the MTJ stack and may therefore prevent undesired shorting of the MTJ stack. Further, the lower contact may further protect the MTJ stack even when the upper contact is misaligned to the MTJ stack.

18 Claims, 12 Drawing Sheets

DUAL LAYER TOP CONTACT FOR MAGNETIC TUNNEL JUNCTION STACK

BACKGROUND

Various embodiments of the present application generally relate semiconductor device fabrication methods and resulting structures. More specifically the various embodiments may relate to a Magneto-Resistive Random Access Memory (MRAM) semiconductor structure that includes a dual layer top contact for the MRAM Magnetic Tunnel Junction (MTJ) stack.

SUMMARY

In an embodiment of the present invention, a semiconductor device is presented. The semiconductor device includes a magnetic tunnel junction stack and a dual layer contact upon the magnetic tunnel junction stack. The magnetic tunnel junction stack includes a bottom electrode, magnetic tunnel junction layers upon the bottom electrode, and a top electrode upon the magnetic tunnel junction layers. The dual layer contact includes a conductive lower contact in physical contact with the top electrode and a conductive upper contact in physical contact with at least a portion of a top surface of the conductive lower contact. The conductive lower contact is relatively wider than the conductive upper contact.

In an embodiment of the present invention, another semiconductor device is presented. The semiconductor device includes a magnetic tunnel junction stack and a dual layer contact upon the magnetic tunnel junction stack. The magnetic tunnel junction stack includes a bottom electrode, magnetic tunnel junction layers upon the bottom electrode, and a top electrode upon the magnetic tunnel junction layers. The dual layer contact includes a conductive lower contact in physical contact with the top electrode and a conductive upper contact in physical contact with at least a portion of a top surface of the conductive lower contact. The conductive lower contact includes outwardly sloped sidewalls and is wider than the conductive upper contact and is wider than the magnetic tunnel junction stack.

In an embodiment of the present invention, yet another semiconductor device is presented. The semiconductor device includes a magnetic tunnel junction stack and a dual layer contact upon the magnetic tunnel junction stack. The magnetic tunnel junction stack includes a bottom electrode, magnetic tunnel junction layers upon the bottom electrode, and a top electrode upon the magnetic tunnel junction layers. The dual layer contact includes a conductive lower contact in physical contact with the top electrode and a conductive upper contact in physical contact with at least a portion of a top surface of the conductive lower contact. The conductive lower contact includes inwardly sloped sidewalls and is wider than the conductive upper contact and is wider than the magnetic tunnel junction stack.

In another embodiment of the present invention, a semiconductor device fabrication method is presented. The method includes forming a magnetic tunnel junction stack comprising a bottom electrode, magnetic tunnel junction layers upon the bottom electrode, and a top electrode upon the MTJ layers. The method further includes forming a lower inter-layer dielectric comprising a lower contact opening that exposes at least a portion of the top electrode. The method further includes forming a conductive lower contact in physical contact with the top electrode within the lower contact opening. The method further includes forming a upper inter-layer dielectric upon the lower inter-layer dielectric and upon the conductive lower contact. The upper inter-layer dielectric includes a upper contact opening that exposes at least a portion of the conductive lower contact. The method further includes forming a conductive upper contact in physical contact with the conductive lower contact within the upper contact opening. The conductive lower contact is relatively wider than the conductive upper contact.

In another embodiment of the present invention, another semiconductor device fabrication method is presented. The method includes forming a magnetic tunnel junction stack comprising a bottom electrode, magnetic tunnel junction layers upon the bottom electrode, and a top electrode upon the magnetic tunnel junction layers. The method further includes forming a lower inter-layer dielectric comprising a top surface that is coplanar with a top surface of the top electrode. The method further includes forming a conductive lower contact layer upon the lower inter-layer dielectric and upon the top surface of the top electrode. The method further includes forming a conductive lower contact in physical contact with the top electrode by removing one or more potion(s) of the conductive lower contact layer. The method further includes forming a upper inter-layer dielectric upon the lower inter-layer dielectric and upon the conductive lower contact. The upper inter-layer dielectric includes a upper contact opening that exposes at least a portion of the conductive lower contact. The method further includes forming a conductive upper contact in physical contact with the conductive lower contact within the upper contact opening. The conductive lower contact is relatively wider than the conductive upper contact.

These and other embodiments, features, aspects, and advantages will become better understood with reference to the following description, appended claims, and accompanying drawings.

DETAILED DESCRIPTION

Figure 1:
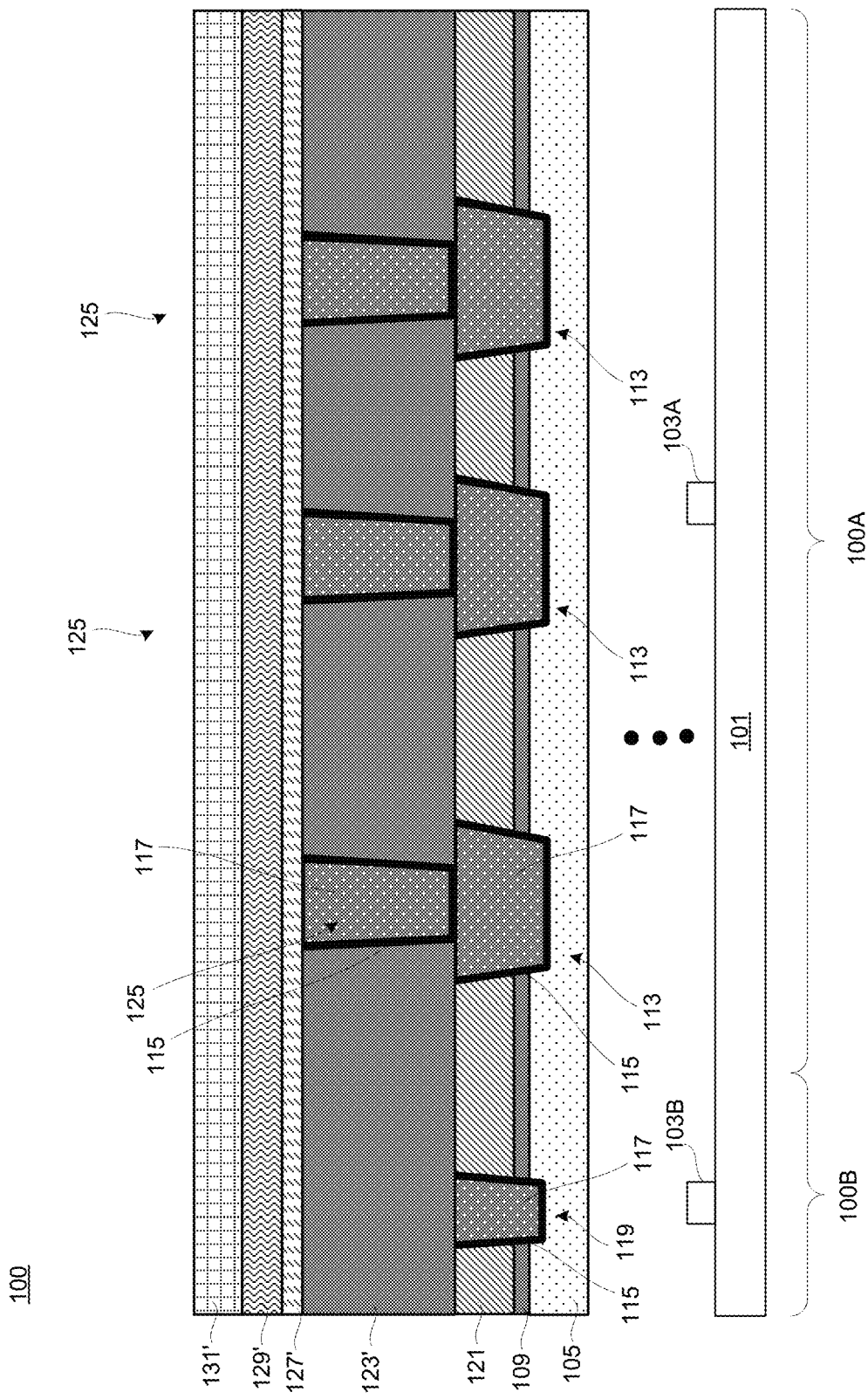
FIG. 1 through FIG. 11 depict cross-sectional views of a semiconductor device shown after respective fabrication operations, in accordance with one or more embodiments.

Semiconductor memories are used in integrated circuits for electronic applications, including radios, televisions, cell phones, and personal computing devices, as examples. One type of semiconductor memory device is MRAM, which involves spin electronics that combines semiconductor technology and magnetic materials and devices. The spins of electrons, through their magnetic moments, rather than the charge of the electrons, are used to indicate bit values.

A typical MRAM cell may include a MTJ stack and a top electrode over the MTJ stack. In the various embodiments, a dual layer top contact is formed over and is physically and electrically connected to the top electrode. The dual layer top contact includes a lower contact and an upper contact. The lower contact may be thinner and wider relative to the upper contact. The thinness or shallowness of the lower contact may prevent the lower contact from reaching and electrically shorting the MTJ stack sidewall(s). For example, the shallow or thin geometry of a lower contact opening allows for a more controlled etch (e.g., more controlled, uniform, etc. etchant exposure, or the like). The controlled etch decreases the propensity for over etching the lower contact opening downward into the MTJ stack which may ultimately cause an undesired electrical short therewith. The width of the lower contact may effectively cover or protect the MTJ stack (e.g., and/or associated encapsulation, etc.) from the upper contact reaching and electrically shorting the MTJ stack sidewall(s), even when the upper contact is misaligned to the MTJ stack.

It is understood in advance that although a detailed description is provided herein of an exemplary MRAM architecture that includes a dual layer contact, implementation of the teachings recited herein are not limited to the particular MRAM architecture described herein. Rather, embodiments of the present invention are capable of being implemented in conjunction with any other appropriate type of memory, semiconductor, or integrated circuit (IC) device now known or later developed.

Whereas a single layer top contact, as is known in the art, can reach MTJ pillar sidewalls and cause shorts, the dual layer top contact may decrease the propensity for shorts. The dual layer top contact may extend MRAM usefulness in next generation semiconductor device nodes. Whereas current MRAM fabrications typically require the top electrode to be relatively tall in order to prevent the top contact from reaching the MTJ pillar sidewall. This may increase the MRAM cell height which may limit the extension of MRAM into spacing requirements of advanced nodes. The dual layer top contact may effectively decrease the height of the MRAM cell and may allow the MRAM cell to fit within spacing requirements of advanced nodes.

Various embodiments of the present invention are described herein with reference to the related drawings. Alternative embodiments can be devised without departing from the scope of this invention. It is noted that various connections and positional relationships (e.g., over, below, adjacent, etc.) are set forth between elements in the following description and in the drawings. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" upon layer "B" include situations in which one or more intermediate layers (e.g., layer "C") is between layer "A" and layer "B" as long as the relevant characteristics and functionalities of layer "A" and layer "B" are not substantially changed by the intermediate layer(s).

For purposes of the description hereinafter, the terms "upper," "lower," "right," "left," "vertical," "horizontal," "top," "bottom," and derivatives thereof relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact," or the like, means that a first element, such as a first structure, and a second element, such as a second structure, are connected without any intermediary conducting, insulating or semiconductor layers at the interface of the two elements. It should be noted that the term "selective to," such as, for example, "a first element selective to a second element," means that the first element can be etched and the second element can act as an etch stop.

The terms "about," "substantially," "approximately," and variations thereof, are intended to include the degree of error associated with measurement of the particular quantity based upon the equipment available at the time of filing the application. For example, substantial coplanarity between various materials can include an appropriate manufacturing tolerance of ±8%, ±5%, ±2%, or the like, difference between the coplanar materials.

For the sake of brevity, conventional techniques related to semiconductor device and IC fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), and chemical-mechanical planarization (CMP), and the like. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

Turning now to a more detailed description of technologies that are more specifically relevant to aspects of the present invention, a MRAM generally includes two ferromagnetic plates, each of which can hold a magnetization, separated by a thin insulating layer. One of the two plates is generally a permanent magnet set to a particular polarity and the other plate's magnetization can be changed to match that of an external field to store memory. This configuration is known as a MTJ and is the simplest structure for an MRAM cell. A memory device may be built from a grid of such cells.

The MRAM may be read by measuring the electrical resistance of the cell. A particular cell is typically selected by powering an associated transistor that switches current from a supply line through the cell to ground. Because of tunnel magnetoresi stance, the electrical resistance of the cell changes with the relative orientation of the magnetization in the two plates. By measuring the resulting current, the resistance inside any particular cell can be determined, and from this the magnetization polarity of the writable plate. Typically, if the two plates have the same magnetization alignment (low resistance state) this is considered to mean "1", while if the alignment is antiparallel the resistance will be higher (high resistance state) and this means "0".

One or more embodiments of the invention also provide fabrication methods and resulting device structures that include an dual layer top contact upon the MTJ stack. The dual layer top contact may decrease the propensity for top contact to MTJ stack shorting and may further allow for the reduction of MRAM cell height, which may extend MRAM into next generation semiconductor device nodes.

FIGS. 1 through 11 are cross-sectional views of intermediate stages in the formation of a semiconductor device 100 and/or 200 in accordance with some embodiments. Referring to FIG. 1, the semiconductor device 100 includes a memory region 100A and a logic region 100B over a same substrate 101, where one or more memory devices (e.g., MRAM devices) are formed in the memory region 100A and one or more logic devices (e.g., logic circuits) are formed in the logic region 100B. In some embodiments, electrical components 103A and 103B are formed in or on the substrate 101, and an interconnect structure, which includes a plurality of dielectric layers and electrically conductive features (e.g., metal lines and vias) formed in the dielectric layers, is formed over the substrate 101 to connect the electrical components 103A and 103B to form functional circuits of the semiconductor device 100.

The substrate 101 may be a semiconductor substrate, such as silicon, doped or undoped, or an active layer of a semiconductor-on-insulator (SOI) substrate. The semiconductor substrate may include other semiconductor materials, such as germanium; a compound semiconductor including silicon carbide, gallium arsenic, gallium phosphide, gallium nitride, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used. The electrical components 103A and 103B may be, e.g., transistors, diodes, capacitors, resistors, or the like, formed by any suitable formation method.

In some embodiments, the interconnect structure comprises a plurality of metallization layers that are formed over the substrate 101 and the electrical components 103A and 103B. The metallization layers may be denoted as Mx, where x=0, 1, 2, . . . , where M0 refers to the lowest (e.g., closest to the substrate 101) metallization layer, and the index x increases by 1 for each additional metallization layer. The metallization layer M0 comprises one or more Inter-Layer Dielectric (ILD) layers and electrically conductive features, such as contact plugs, within the ILD layer(s) to electrically connect to the electrical components 103A and 103B. The metallization layer Mx (with x greater or equal to 1) comprises an Inter-Metal Dielectric (IMD) layer and electrically conductive features (e.g., metal lines and vias) within the TMD layer. In some embodiments, electrically conductive features, such as conductive lines and vias, provide electrical connection to underlying conductive features.

The ILD layer(s) and the IMD layers may be formed of any suitable dielectric material, for example, a nitride such as silicon nitride; an oxide such as silicon oxide, phosphosilicate glass (PSG), borosilicate glass (BSG), boron-doped phosphosilicate glass (BPSG), or the like; or the like. The ILD layer(s) and the IMD layers may be formed by any acceptable deposition process, such as spin coating, physical vapor deposition (PVD), chemical vapor deposition (CVD), the like, or a combination thereof. The electrically conductive features in the ILD layer(s) and the IMD layers may be formed through any suitable process, such as deposition, damascene, dual damascene, the like, or combinations thereof.

FIG. 1 illustrates metallization layers Mx and Mx+1 over the substrate 101. In some embodiments, the metallization layer Mx may be the metallization layer M0 and may contact the substrate 101. In other embodiments, other metallization layers may be interposed between the metallization layer Mx and the substrate 101. For simplicity, in subsequent figures, the substrate 101 and the electrical components 103A and 103B may not be illustrated.

In some embodiments, the metallization layer Mx comprises a dielectric layer(s) 121, 109, 105 and conductive features 113, 119 within the dielectric layer(s) 121, 109, 105. In some embodiments, the dielectric layer 105 is a low-k dielectric layer having a k value lower than about 3.0, TEOS oxide (silicon oxide deposited using, e.g., a Chemical Vapor Deposition (CVD) method with Tetra Ethyl Ortho Silicate (TEOS) as a precursor), or the like, for example.

The dielectric layer 121 may also be formed of a low-k dielectric material with a k value lower than about 3.0, for example and may be formed using CVD, Physical Vapor Deposition (PVD), or the like.

In some embodiments, a cap layer 109 is formed between the dielectric layer 105 and the dielectric layer 121. In some embodiments, the cap layer 109 is formed of a dielectric layer that is different from the overlying dielectric layer 121. For example, the cap layer 109 may be formed of TEOS oxide, aluminum oxide, silicon oxide, silicon nitride, silicon oxynitride, silicon carbide, a combination thereof, or the like. The cap layer 109 may also be a composite layer formed of a plurality of dielectric layers. For example, the cap layer 109 may include one or more layers of SiC, SiN, Nitrogen doped SiC (SiCN) or Nitrogen and Hydrogen doped SiC (SiCNH), or the like. The cap layer 109 may be formed using CVD, Physical Vapor Deposition (PVD), or the like.

The conductive features 113, 119 may be formed of metals such as copper, aluminum, tungsten, cobalt, metal alloys thereof, or the like. In some embodiments where the metallization layer Mx is the metallization layer M0, the conductive features 113, 119 are contact plugs and conductive features 125 there above, respectively, may be metal lines (such as word lines or bit lines), metal contacts, doped semiconductor strips, or the like. In other embodiments where the metallization layer Mx is a metallization layer with x greater than 1, as depicted, the conductive features 113, 119 may be metal lines, doped semiconductor strips, or the like.

In some embodiments, conductive features 113, 119 include conductive regions 117 and conductive barrier layers 115 lining sidewalls and bottom surfaces of the conductive regions 117. The conductive barrier layers 115 may be formed of titanium, titanium nitride, tantalum, tantalum nitride, cobalt, a combination thereof, or the like. The conductive regions 117 may be formed of metals such as copper, aluminum, tungsten, cobalt, alloys thereof, or the like. The formation of vias may include etching the dielectric layer(s) to form via openings, forming a blanket conductive barrier layer extending into the via openings, depositing a metallic or conductive material (i.e., conductive regions 117) over the blanket conductive barrier layer 115, and performing a planarization process, such as a CMP process or a mechanical grinding process, to remove excess portions of the blanket conductive barrier layer 115 and the conductive material.

In some embodiments, Mx is a metallization layer with x greater than 2 and comprises a dielectric layer 123' and conductive features 125, such as conductive vias, within the dielectric layer 123'. In some embodiments, the dielectric layer 123' may be formed of a TEOS oxide. In other embodiments, the dielectric layer 123' may be formed using PSG, BSG, BPSG, Undoped Silicate Glass (USG), Fluorosilicate Glass (FSG), SiOCH, flowable oxide, a porous oxide, SiN, SiC, nitrogen doped SiC (SiCN), Nitrogen and Hydrogen doped SiC (SiCNH) or the like, or combinations thereof.

The conductive features 125 may be formed of metals such as copper, aluminum, tungsten, cobalt, metal alloys thereof, or the like. In some embodiments, as depicted, the conductive features 125 are metal vias and the conductive features 113, 119 are word lines.

In some embodiments, conductive features 125 include conductive regions 117 and conductive barrier layers 115 lining sidewalls and bottom surfaces of the conductive regions 117. The conductive barrier layers 115 may be formed of titanium, titanium nitride, tantalum, tantalum nitride, cobalt, a combination thereof, or the like. The conductive regions 117 may be formed of metals such as copper, aluminum, tungsten, cobalt, alloys thereof, or the like. The formation of vias may include etching the dielectric layer(s) to form via openings, forming a blanket conductive barrier layer extending into the via openings, depositing a metallic or conductive material 117 over the blanket conductive barrier layer 115, and performing a planarization process, such as a Chemical Mechanical Polish (CMP) process or a mechanical grinding process, to remove excess portions of the blanket conductive barrier layer 115 and the conductive material 117.

A bottom electrode (BE) layer 127' may be formed over the dielectric layer 123' and the conductive features 125, MTJ layers 127' may be formed over the BE layer 127', and a top electrode (TE) layer 131' may be formed over the MTJ layers 129'. In some embodiments, the BE layer 127' is formed as a blanket layer, and may be formed using CVD, Physical Vapor Deposition (PVD), Electro-Chemical Plating (ECP), Electroless plating, or the like. The material of the BE layer 127' may include Cu, Al, Ti, Ta, W, Pt, Ni, Cr, Ru, TiN, TaN, combinations thereof, multi-layers thereof, or the like. In an embodiment where the BE layer 127' comprises a multilayer, the BE layer 127' may comprise a first layer and a second layer over the first layer. In some embodiments, the first layer has a thickness between about 50 Å and about 500 Å. In some embodiments, the second layer has a thickness between about 50 Å and about 500 Å. In some embodiments, the BE layer 127' has a thickness between about 100 Å and about 600 Å.

In some embodiments, the MTJ layers 129' include a bottom magnetic electrode layer, a tunnel barrier layer over the bottom magnetic electrode layer, and a top magnetic electrode layer over the tunnel barrier layer. The bottom magnetic electrode layer may include a pinning layer and a pinned layer over and contacting the pinning layer. The top magnetic electrode layer may include a free layer. The bottom magnetic electrode layer, the tunnel barrier layer, and the top magnetic electrode layer may be deposited using one or more deposition methods such as, CVD, PVD, ALD, a combination thereof, or the like.

The pinning layer may be formed of a metal alloy including manganese (Mn) and another metal(s) such as platinum (Pt), iridium (Ir), rhodium (Rh), nickel (Ni), palladium (Pd), iron (Fe), osmium (Os), or the like. Accordingly, the pinning layer may be formed of PtMn, IrMn, RhMn, NiMn, PdPtMn, FeMn, Os, Mn, or the like. The pinning layer may have a thickness in the range between about 50 Å and about 200 Å.

The pinned layer may be formed of a ferromagnetic material with a greater coercivity field than top magnetic electrode layer and may be formed of materials 'such as cobalt iron (CoFe), cobalt iron boron (CoFeB), a combination thereof, or the like. The pinned layer may have a thickness in the range between about 50 Å and about 200 Å. In some embodiments, the pinned layer has a synthetic ferromagnetic (SFM) structure, in which the coupling between magnetic layers is ferromagnetic coupling. The bottom magnetic electrode layer may also adopt a synthetic antiferromagnetic (SAF) structure including a plurality of magnetic metal layers separated by a plurality of non-magnetic spacer layers. The magnetic metal layers may be formed of Co, Fe, Ni, or the like. The non-magnetic spacer layers may be formed of Cu, Ru, Ir, Pt, W, Ta, Mg, or the like. For example, the bottom magnetic electrode layer may have a Co layer and repeated (Pt/Co)x layers over the Co layer, with x representing repeating number and may be any integer equal to or greater than 1.

The tunnel barrier layer may be formed of a dielectric material, such as MgO, AlO, AlN, a combination thereof, or the like. The tunnel barrier layer may have a thickness in the range between about 1 nm and about 10 nm.

The top magnetic electrode layer may be formed of a ferromagnetic material such as CoFe, NiFe, CoFeB, CoFeBW, a combination thereof, or the like. The top magnetic electrode layer may also adopt a synthetic ferromagnetic structure, which is similar to the SAF structure, with the thickness of the spacer layer adjusted to achieve the ferromagnetic coupling between the separated magnetic metals, i.e., causing the magnetic moment to be coupled in the same direction. The magnetic moment of the top magnetic electrode layer is programmable, and the resistance of the resulting MTJ structure is accordingly changed between a high resistance and a low resistance. It is realized that the materials and the structure of the MTJ layers 129' may have many variations, which are also within the scope of the present disclosure. For example, the free layer may be the bottom layer of MTJ layers 129', while the pinning layer may be the top layer.

TE layer 131' may be formed over the MTJ layers 129'. In some embodiments, the TE layer 131' is formed as a blanket layer, and may be formed using CVD, PVD, ECP, electroless plating, or the like. The material of the TE layer 131' may include aluminum, titanium, tantalum, tungsten, alloys thereof, multi-layers thereof, or the like. In some embodiments, the TE layer 131' may be used as a hard mask in the subsequent patterning of the MTJ layers 129' and may include a conductive layer formed of TiN, Ta, TaN, Ti, Ru, W, Si, alloys thereof, multi-layers thereof, or the like.

In an embodiment where the TE layer 131' comprises a multilayer, the TE layer 131' may comprise a first layer, a second layer over the first layer, and a third layer over the second layer, with the first layer being made of Ta, the second layer being made of TaN, and the third layer being made of Ta. In some embodiments, the first layer has a thickness between about 100 Å and about 1000 Å. In some embodiments, the second layer has a thickness between about 100 Å and about 1000 Å. In some embodiments, the third layer has a thickness between about 100 Å and about 1000 Å. In some embodiments, the TE layer 131' has a thickness between about 200 Å and about 2000 Å. In some embodiments, the thickness of the TE layer 131' is greater than the thickness of the BE layer 127'.

After forming the TE layer 131', one or more masks (not shown) may be formed over the TE layer 131'. In some embodiments, the one or more masks may comprise one or more hard masks, a tri-layer mask, a combination thereof, or the like. In some embodiments, a hard mask layer is formed over the TE layer 131' and a tri-layer mask is formed over the hard mask layer. In some embodiments, the hard mask layer may comprise TiO, a TEOS oxide, SiN, SiCN, SiON, a combination thereof, or the like. In some embodiments, the hard mask layer has a thickness between about 50 Å and about 300 Å.

Figure 2:
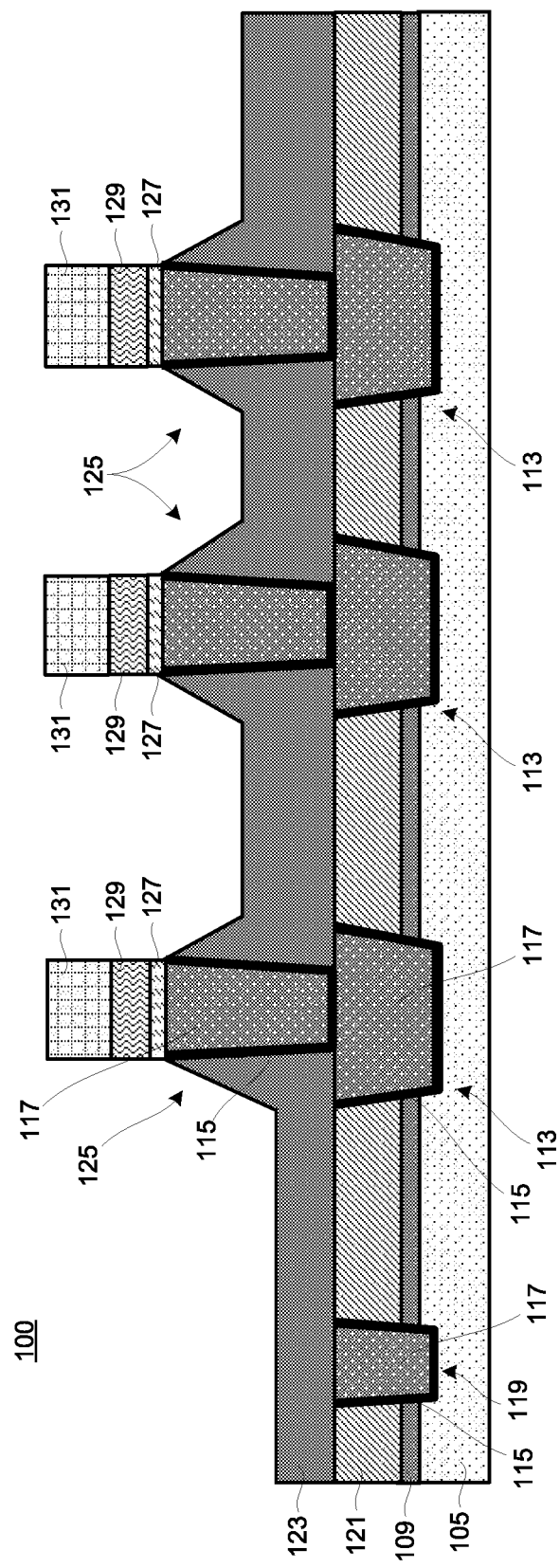

Referring to FIG. 2, MTJ stacks are formed by patterning the BE layer 127', the MTJ layers 129', and the TE 131'. The patterning process forms a MTJ stack which may include a BE 127, formed from a retained portion of the BE layer 127', a MTJ 129, formed from a retained portion of the MTJ layers 129', and a TE 131, formed from a retained portion of the TE 131'. The layers of the MTJ stack may be generally vertically aligned with substantially coplanar sidewalls and may be located upon conductive features 125.

In some embodiments, the patterning process may partially etch the dielectric layer 123. In such embodiments, the dielectric layer 123 comprises a sloped portion (generally associated with the conductive feature 125) and flat portion(s). In some embodiments, top surfaces of the sloped portions are above a top surface of the flat portion. In some embodiments, the sloped portions have sloped sidewalls. In some embodiments, the sloped portions have trapezoidal shapes in the illustrated cross-section.

In some embodiments, the MTJ stack has sloped sidewalls. In some embodiments, a width of the TE 131 is less than a width of the BE 127. In some embodiments, the MTJ stack has substantially vertical sidewalls. In some embodiments, a width of the TE 131 is substantially the same width of BE 127.

In some embodiments, the one or more MTJ stack formation etching processes may include a plasma etching method, such as an IBE process. In some embodiments, the IBE process may be performed in conjunction with a magnetic treatment that allows for avoiding the electrical shorting caused by the re-sputtering of metal elements on sidewalls of the MTJ stack occurring during the IBE process. In some embodiments, the magnetic treatment removes metallic particles from the sidewalls of the MTJ stack.

Figure 3:
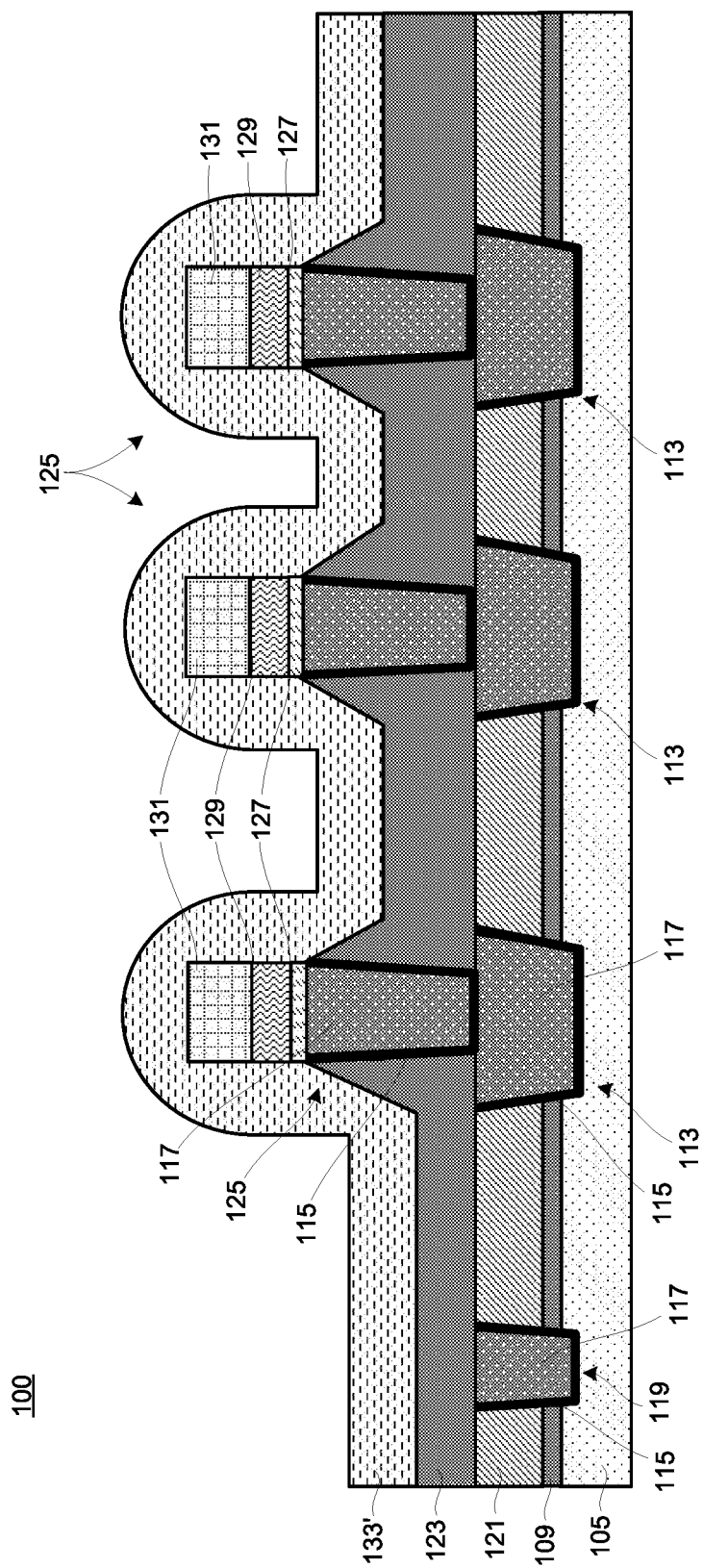

Referring to FIG. 3, after MTJ stack formation, various protective layers may be formed on sidewalls and top surfaces of the MTJ stack. In some embodiments, oxide layers may be formed on sidewalls of the MTJ stack. In some embodiments, the oxide layers comprise oxides of metal elements that form the MTJ stack and may be formed using an oxidation process. In some embodiments, the oxide layers prevent electron flow along the sidewalls of the MTJ stack that may adversely affect magnetic performance of the MTJ layers 129. In some embodiment, the oxide layers may have a thickness between about 200 Å and about 2000 Å.

In some embodiments, a passivation layer 133' is blanket formed over the MTJ stack and upon dielectric layer 123. In some embodiments, the passivation layer 133' may comprise silicon oxide, silicon nitride, silicon oxynitride, silicon carbide, silicon carbonitride, a combination thereof, or the like, and may be formed using CVD, PECVD, ALD, PELAD, PVD, a combination thereof, or the like. In some embodiments, the passivation layer 133' may reduce or prevent moisture ($H_2O$) diffusion into the MTJ stack. In some embodiments, the passivation layer 133' may have a thickness between about 100 Å and about 800 Å.

Figure 4:
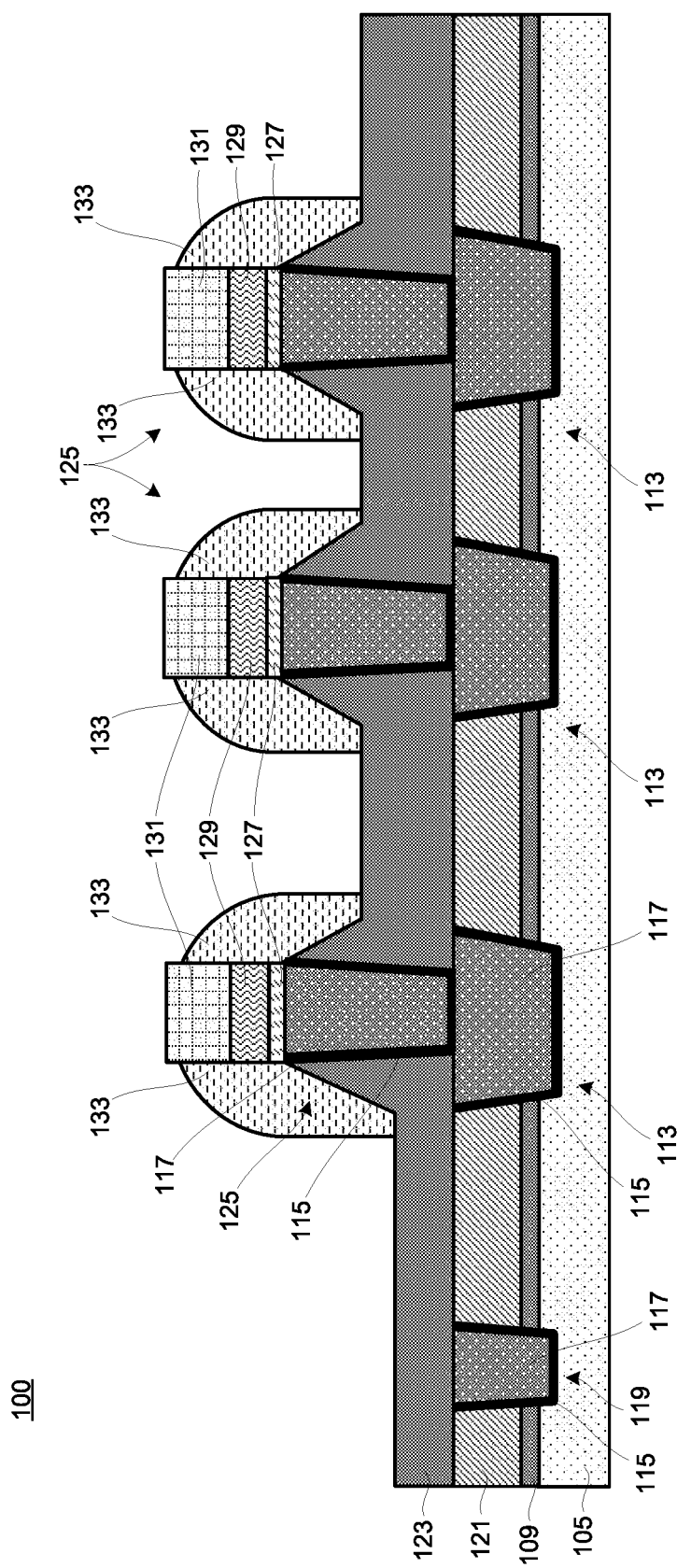

Referring to FIG. 4, a etching process, such as a dry etch, may be performed to etch the passivation layer 133' and to expose top portions of the MTJ stack (e.g., top portions of the TE 131). Retained portion(s) of the passivation layer 133' form encapsulation spacers 133 are located upon the sidewalls of the MTJ stack and may be further located upon the sloped portion of dielectric layer 123. In some embodiments, the etching process is an anisotropic etching process and removes horizontal portions of the passivation layer 133'.

In some embodiments, encapsulation spacer 133 may be a multilayer structure. In such embodiments, for example, a second passivation layer (not shown) may be formed over the MTJ stack and upon the encapsulation spacers 133, followed by an oxide layer (not shown) formed over the passivation layer. In some embodiments, the second passivation layer may be formed using similar materials and methods as the passivation layer 133' described above with reference to FIG. 3 and the description is not repeated herein. In some embodiments, the oxide layer may comprise silicon oxide, or the like, and may be formed using CVD, PECVD, ALD, PELAD, a combination thereof, or the like. Subsequently, one or more dry etching processes are performed to etch the second passivation layer and the oxide layer and to re-expose top portions of the MTJ stack (e.g., portions of the TEs 131). In some embodiments, the one or more dry etching processes are anisotropic etching processes and remove horizontal portions of the second passivation layer and the oxide layer. Where encapsulation spacer 133 is a multilayer structure, the portions of the passivation layer 133', the second passivation layer, and the oxide layer form encapsulation spacer 133 on the sidewalls of the MTJ stack.

Figure 5:
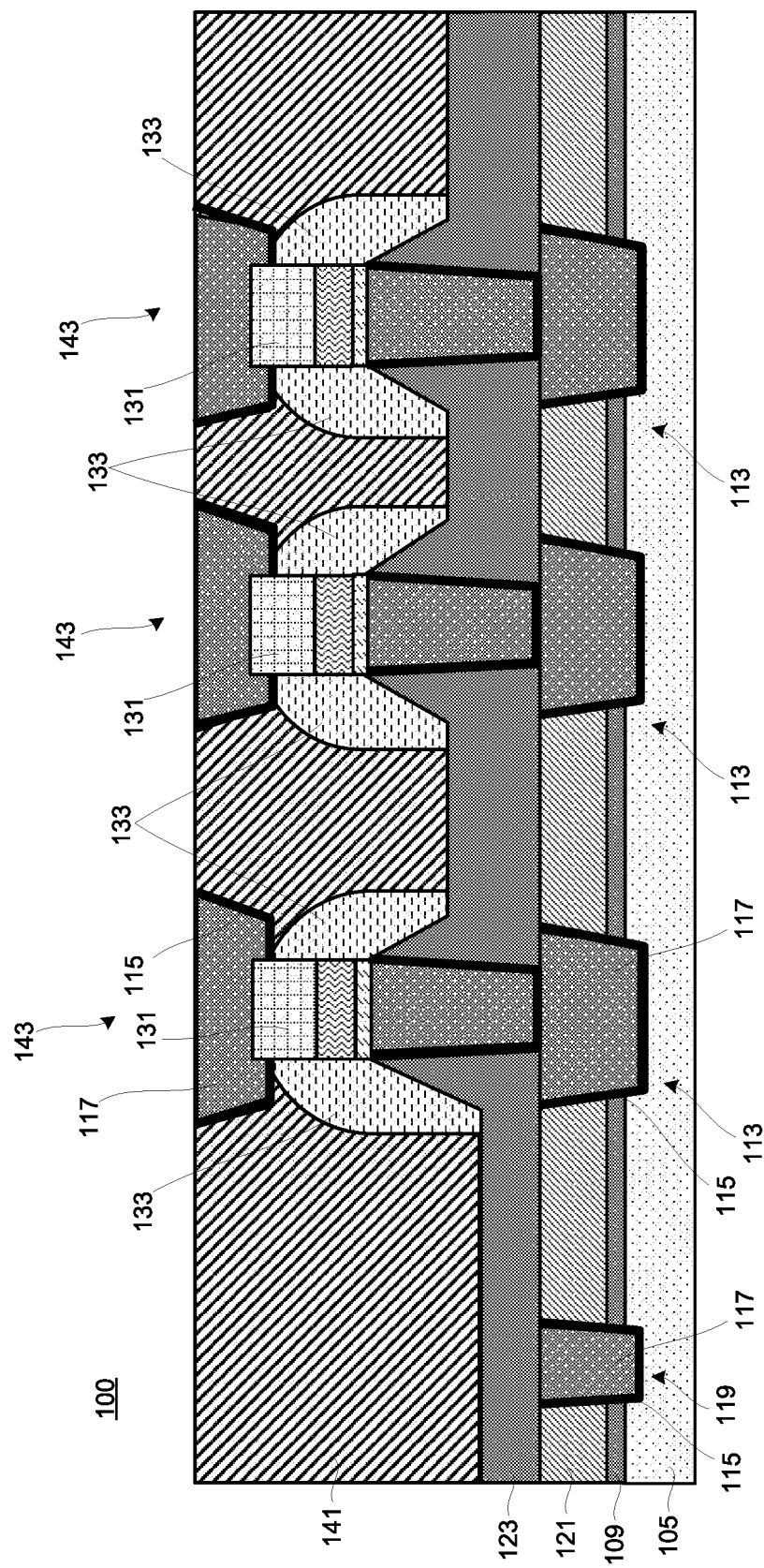

Referring to FIG. 5, one or more inter-layer dielectric layer(s) 141 are formed upon the dielectric layer 123, upon encapsulation spacer 133, and upon the exposed portion of the MTJ stack. In some embodiments, the inter-layer dielectric layer(s) 141 may be formed using similar materials and methods as the dielectric layer 121 or other inter-layer dielectrics described above, and the description is not repeated herein. Inter-layer dielectric layer(s) 141 may be formed to an adequate thickness so that there is a distance between 200 Å and 2000 Å between the top surface of the MTJ stack (e.g., top surface of the TE 131) and the top surface of the inter-layer dielectric layer(s) 141.

Figure 6:
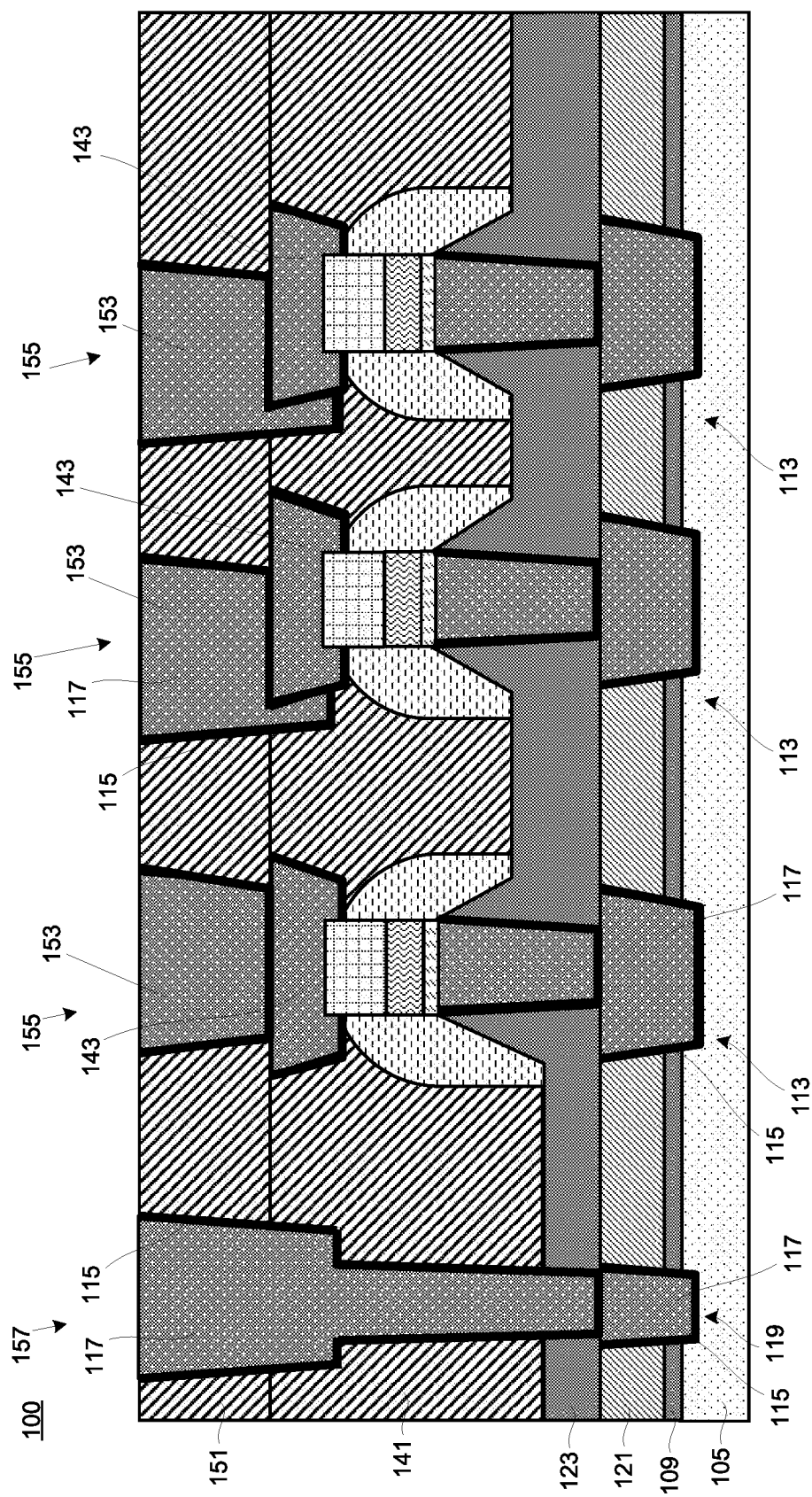

Referring to FIG. 5, lower contact 143 of a dual layer contact 155, shown for example in FIG. 6, is formed in the inter-layer dielectric layer(s) 141 generally between the MTJ stack and the top surface of the inter-layer dielectric layer(s) 141. The lower contact 143 may be a conductive line, via, or other conductive wiring feature, and may be formed using suitable formation methods such as damascene, dual-damascene, deposition, plating, combinations thereof, or the like.

In some embodiments, one or more mask layers (not shown) aid in formation of lower contact 143 openings in the inter-layer dielectric layer(s) 141. In some embodiments, the lower contact 143 openings are formed by a via-first process. In other embodiments, the lower contact 143 openings are formed by a trench-first process. Subsequently, the lower contact 143 openings may be filled with suitable conductive material(s). As depicted, the lower contact 143 opening fabrication process or technique may produce generally sloped sidewalls which may result in a trapezoidal lower contact 143 that includes two substantially parallel sides (i.e., upper and lower surfaces) and two outwardly sloped sides or sidewalls (i.e., sides become further away from the bottom of the contact 143) that may share a bisector line of symmetry.

In some embodiments, as lower contact 143 and/or conductive features 125, 113, 119, or the like, may be formed by an additive fabrication process as described, both the lower contact 143, the conductive features 125, 113, 119, and the upper contact 153, etc. may share the same orientation of outwardly sloped sides or sidewall(s), as depicted.

In some embodiments, lower contact 143 includes conductive regions 117 and conductive barrier layers 115 lining sidewalls and bottom surfaces of the conductive regions 117. A planarization process, such as CMP process or a mechanical grinding process, may remove excess lower contact 143 material(s) and may planarize the top surface of inter-layer dielectric layer(s) 141 and the top surface of lower contact 143.

In some embodiments, as depicted, lower contact 143 is wider than the underlying MTJ stack (e.g., sidewalls of the lower contact 143 are outside the sidewalls of the MTJ stack). In alternative embodiments, lower contact 143 is wider than the one or more of the underlying encapsulation spacer(s) 133 (e.g., sidewalls of the lower contact 143 are outside the sidewalls of the encapsulation spacer 133, etc.). In alternative embodiments, a lateral width of the lower contact is less than a lateral width of the encapsulation spacer and greater than a lateral width of the MTJ stack. The width of the lower contact 143 should be adequately large enough, based on expected misalignment of the lower contact 143 to the MTJ stack and the expected misalignment of the upper contact 153 of the dual layer contact 155 to the lower contact 143, to prevent the upper contact 153 from contacting sidewalls of the MJT stack.

The thinness or shallowness of the lower contact 144 may prevent the lower contact 144 from reaching and electrically shorting the MTJ stack sidewall(s). For example, the shallow or thin geometry of a lower contact opening allows for a more controlled etch (e.g., more controlled, uniform, etc. etchant exposure, or the like). The controlled etch decreases the propensity for over etching the lower contact opening downward into the MTJ stack which may ultimately cause an undesired electrical short therewith. The width of the lower contact may effectively cover or protect the MTJ stack (e.g., and/or associated encapsulation, etc.) from the upper contact reaching and electrically shorting the MTJ stack sidewall(s).

Referring to FIG. 6, one or more inter-layer dielectric 151 layer(s) are formed upon the inter-layer dielectric layer(s) 141 and upon the exposed upper surface portion(s) of lower contact 143. In some embodiments, inter-layer dielectric layer(s) 151 may be formed using similar materials and methods as the inter-layer dielectric layer(s) 141. In some embodiments, inter-layer dielectric layer(s) 151 may be formed using different materials relative to inter-layer dielectric layer(s) 141. Inter-layer dielectric layer(s) 151 may be formed to a thickness between 500 Å and 2000 Å. In some embodiments, as depicted, inter-layer dielectric layer(s) 151 may be thinner relative to inter-layer dielectric layer(s) 141.

Referring to FIG. 6, upper contact 153 of the dual layer contact 155 is formed in the inter-layer dielectric layer(s) 151 upon and physically connected to the lower contact 143. The upper contact 153 may be a conductive line, via, or other conductive wiring feature, and may be formed using suitable formation methods such as damascene, dual-damascene, deposition, plating, combinations thereof, or the like.

Referring to FIG. 6, logic region contact(s) 157 may also be formed in the inter-layer dielectric layer(s) 141 and in the inter-layer dielectric layer(s) 151 upon and physically connected to conductive feature 119. Logic region contact(s) 157 may be a conductive line, via, or other conductive wiring feature, and may be formed using suitable formation methods such as damascene, dual-damascene, deposition, plating, combinations thereof, or the like. Logic region contact(s) 157 may be formed simultaneously with upper contact 153.

In some embodiments, one or more mask layers (not shown) aid in formation of upper contact 153 openings in the inter-layer dielectric layer(s) 151 and/or logic region contact(s) 157 openings in the inter-layer dielectric layer(s) 141, 151. In some embodiments, the upper contact 153 openings and/or logic region contact(s) 157 openings are formed by a via-first process. In other embodiments, the upper contact 153 openings and/or logic region contact(s) 157 openings are formed by a trench-first process. Subsequently, the upper contact 153 openings and/or logic region contact(s) 157 openings may be filled with suitable conductive material(s).

In some embodiments, upper contact 153 and/or logic region contact 157 openings includes conductive regions 117 and conductive barrier layers 115 lining sidewalls and bottom surfaces of the conductive regions 117. A planarization process, such as CMP process or a mechanical grinding process, may remove excess upper contact 153 material(s) and may planarize the top surface of inter-layer dielectric layer(s) 151, the top surface of upper contact 153, and/or the top surface of logic region contact 157.

In some embodiments, as depicted, due to the requisite width of the lower contact 143 to achieve protection of the underlying MTJ stack and/or the underlying encapsulation spacers 133, upper contact 153 may be narrower than the underlying lower contact 143 (e.g., sidewalls of the upper contact 153 are inside the sidewalls of the underlying associated lower contact 143).

For clarity, semiconductor device 100 includes a dual layer contact 155. The dual layer contact 155 may physically and electrically contact TE 131 of a MTJ stack. The dual layer contact 155 includes lower contact 143 and upper contact 153.

The width of the lower contact 143 may be wider than the MTJ stack, may be wider than the encapsulation spacer(s) 133 of the MTJ stack, or the like. The width of the lower contact 143 should be adequately large enough, based on expected misalignment of the lower contact 143 to the MTJ stack and the expected misalignment of the upper contact 153 to the lower contact 143, to prevent the upper contact 153 from contacting sidewalls of the MJT stack.

The lower contact 143 opening may be shallow relative to the upper contact 153 opening. This shallow or thin geometry of the lower contact 143 opening allows for a more controlled etch (e.g., more controlled, uniform, etc. etchant exposure, or the like). The controlled etch decreases the propensity for over etching the lower contact 143 opening downward into the MTJ layers 129 of the MTJ stack which may ultimately cause an undesired electrical short therewith.

The lower contact 143 is formed in the lower contact 143 opening and may be in physical and electrical contact with portion(s) of the top surface, portion(s) of the sidewall(s) of TE 131, etc. Sidewalls of lower contact 143 may be substantially vertical or sloped, as depicted.

The upper contact 153 opening width may be skinny relative to the lower contact 143 there below. This relatively larger width of the lower contact 143 decreases the propensity for over etching the upper contact 153 opening downward into the MTJ layers 129 of the MTJ stack. Upper contact 153 and logic region contacts 157 may be formed together using damascene process. The upper contact 153 is formed in the upper contact 153 opening and may be in physical and electrical contact with portion(s) of the top surface, portion(s) of the sidewall(s) of the lower contact 143 there below. A less uniform and/or faster etch process can be used in upper contact 153 opening and logic region contacts 157 opening formation, since generous over etch can be added without eroding encapsulation spacers 133 and/or the MTJ stack, which are protected by lower contact 143. Further, due to the width of lower contact 143, the lower contact 143 may further protect the MTJ stack and/or encapsulation spacers 133 even when the upper contact 153 is misaligned to the MTJ stack, as is depicted in FIG. 6. The upper contact 153 may be wider than the MTJ stack there below. Sidewalls of upper contact 153 may be substantially vertical or sloped, as depicted.

Figure 7:
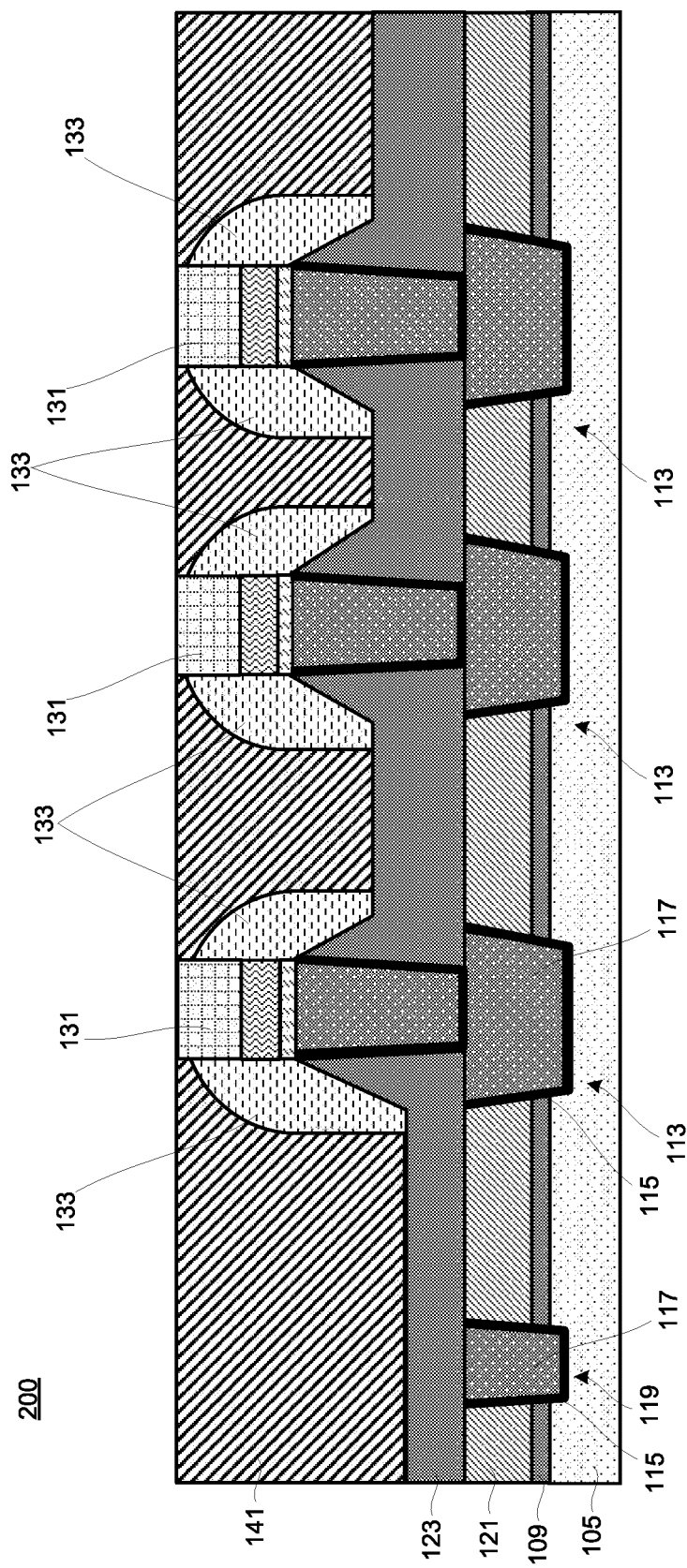

Referring to FIG. 7, the alternative semiconductor device 200 is depicted. Semiconductor device 200 may be formed using similar methods relative to semiconductor device 100. However, rather than the lower contact 143 of semiconductor device 100 being formed by damascene processes, the lower contact 201 of the dual layer contact 155 of semiconductor device 200 may be formed by subtractive or etching processes. To that end, as depicted, the inter-layer dielectric layer(s) 141 may be planarized by performing a planarization process, to remove excess portions of the inter-layer dielectric layer(s) 141. The planarization process may planarize the top surface of the inter-layer dielectric layer(s) 141 and the top surface of the top portions of the MTJ stack (e.g., top surface of the TE 131).

Figure 8:
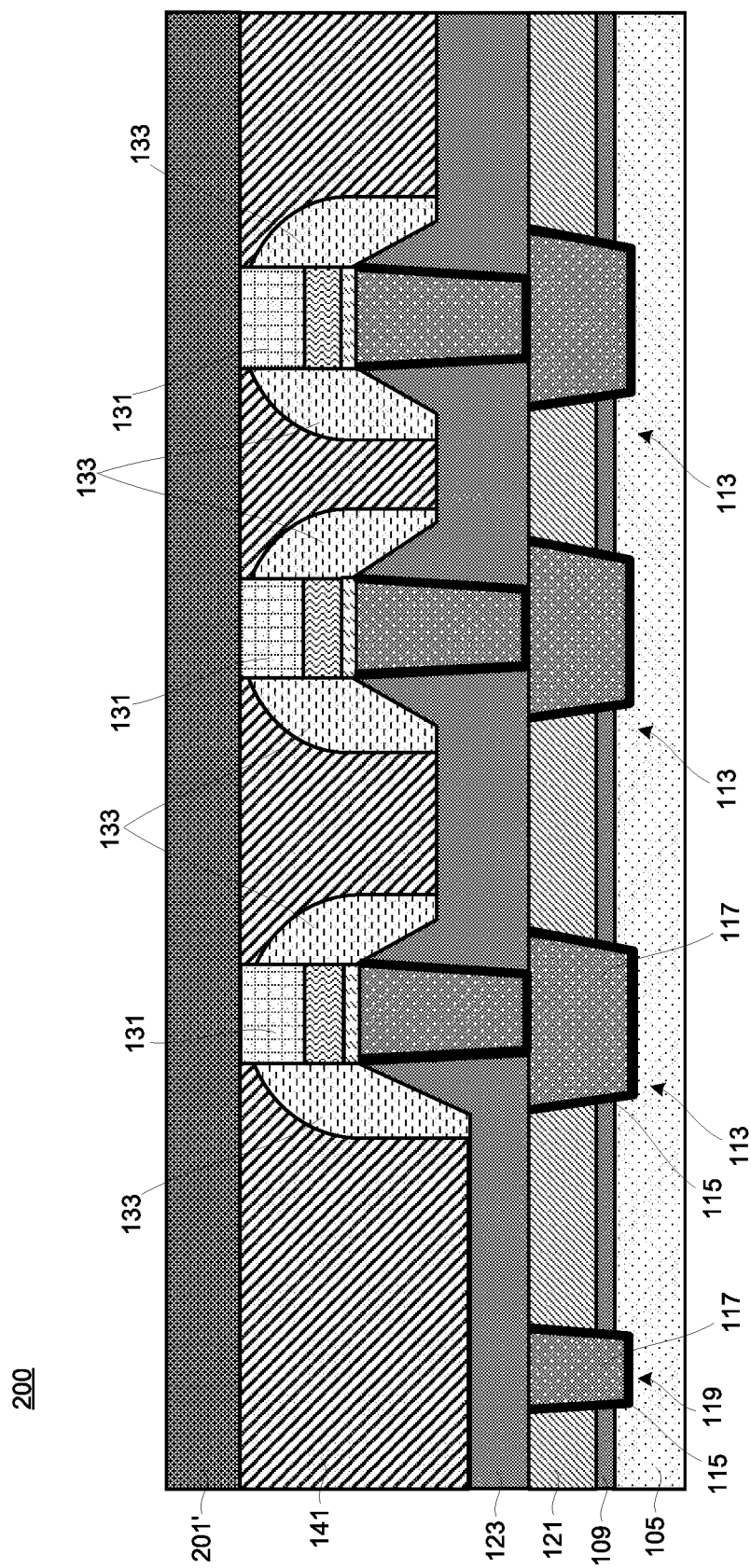

Referring to FIG. 8, lower contact layer 201' may be formed over the inter-layer dielectric layer(s) 141 and over the top surface of the top portions of the MTJ stack (e.g., top surface of the TE 131). In some embodiments, lower contact layer 201' is formed as a blanket layer, and may be formed using CVD, Physical Vapor Deposition (PVD), Electro-Chemical Plating (ECP), Electroless plating, or the like. The material of the lower contact layer 201' may include etchable conductive materials, such as W, Ru, TiN, TaN, combinations thereof, multi-layers thereof, or the like. In some embodiments, the first layer has a thickness between about 200 Å and about 2000 Å. In some embodiments, lower contact layer 201' has a thickness between about 200 Å and about 2000.

After forming lower contact layer 201', one or more masks (not shown) may be formed over the lower contact layer 201'. In some embodiments, the one or more masks may comprise one or more hard masks, a tri-layer mask, a combination thereof, or the like.

Figure 9:
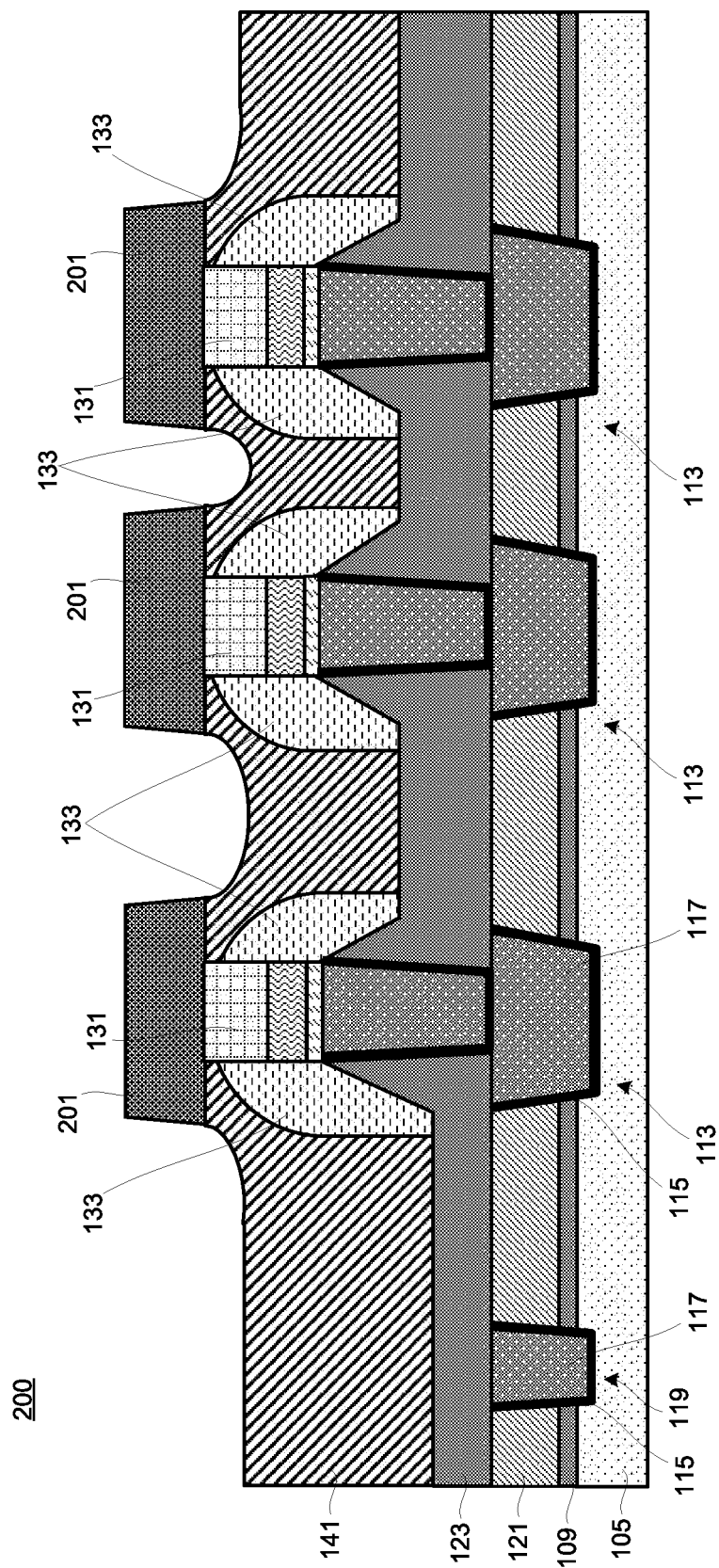

Referring to FIG. 9, lower contact 201 is formed by patterning the lower contact layer 201'. The patterning process forms lower contact 201 from a retained portion of the lower contact layer 201'. The lower contact 201 may be formed upon and physically and electrically connected with an underlying MTJ stack.

In some embodiments, the patterning process may partially etch the inter-layer dielectric layer(s) 141. In such embodiments, the inter-layer dielectric layer(s) 141 may comprise a curved portion (generally associated with the lower contact 201 there above) and flat portion(s). In some embodiments, the curved portions have arced, curved, or circular walls.

In some embodiments, the one or more lower contact 201 formation etching processes may include a wet or dry etching method. As depicted, the lower contact 201 subtractive fabrication process or technique may produce generally sloped sidewalls which may produce a trapezoidal lower contact 201 that includes two substantially parallel sides (i.e., upper and lower surfaces) and two inwardly sloped sides or sidewalls (i.e., sides become closer from the bottom of the contact 201) that may share a bisector line of symmetry.

In some embodiments, as lower contact 201 is fabricated by a substrative fabrication process and/or conductive features 125, 113, 119, and/or upper contact 153, or the like, may be formed by an additive fabrication process as described, the lower contact 201 may have oppositely orientated sloped sides or sidewalls relative thereto, as depicted.

In some embodiments, as depicted, lower contact 201 is wider than the underlying MTJ stack (e.g., sidewalls of the lower contact 143 are outside the sidewalls of the MTJ stack). In alternative embodiments, lower contact 201 is wider than the one or more of the underlying encapsulation spacer(s) 133 (e.g., sidewalls of the lower contact 143 are outside the sidewalls of the encapsulation spacer 133, etc.).

In some embodiments, as depicted, lower contact 201 is wider than the underlying MTJ stack (e.g., sidewalls of the lower contact 201 are outside the sidewalls of the MTJ stack). In alternative embodiments, lower contact 201 is wider than the one or more of the underlying encapsulation spacer(s) 133 (e.g., sidewalls of the lower contact 201 are outside the sidewalls of the encapsulation spacer 133, etc.). In alternative embodiments, a lateral width of the lower contact 201 is less than a lateral width of the encapsulation spacer 133 and greater than a lateral width of the MTJ stack. The width of the lower contact 201 should be adequately large enough, based on expected misalignment of the lower contact 201 to the MTJ stack and the expected misalignment of the upper contact 153 to the lower contact 201, to prevent the upper contact 153 from contacting sidewalls of the MJT stack.

Figure 10:
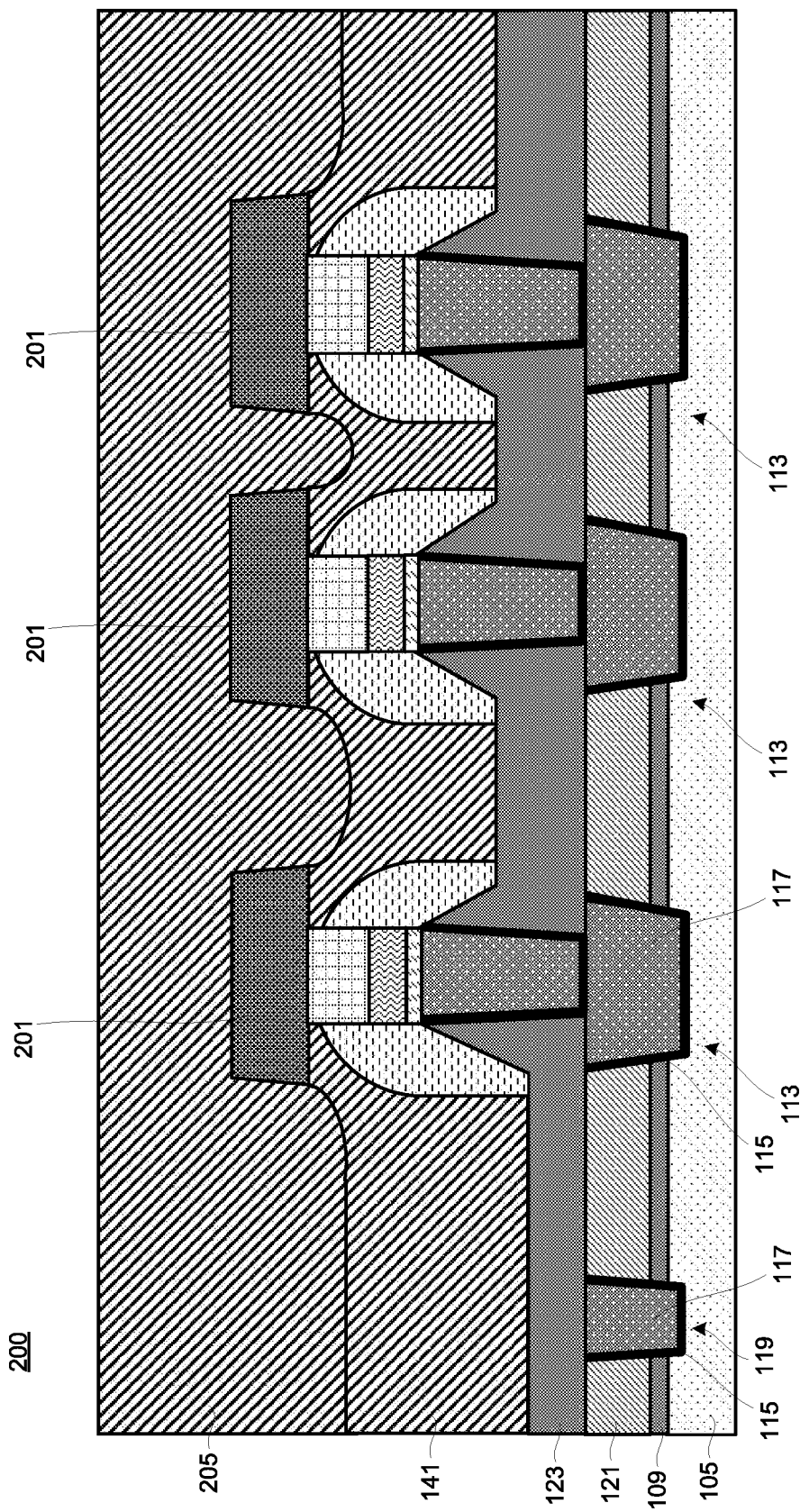

Referring to FIG. 10, one or more inter-layer dielectric 205 layer(s) are formed upon the inter-layer dielectric layer(s) 141 and upon the exposed portion(s) of lower contact 201. In some embodiments, inter-layer dielectric 205 layer(s) may be formed using similar materials and methods as the inter-layer dielectric layer(s) 141. In some embodiments, inter-layer dielectric 205 layer(s) may be formed using different materials relative to inter-layer dielectric layer(s) 141. Inter-layer dielectric 205 may be formed to a thickness between 200 Å and 2000 Å.

Figure 11:
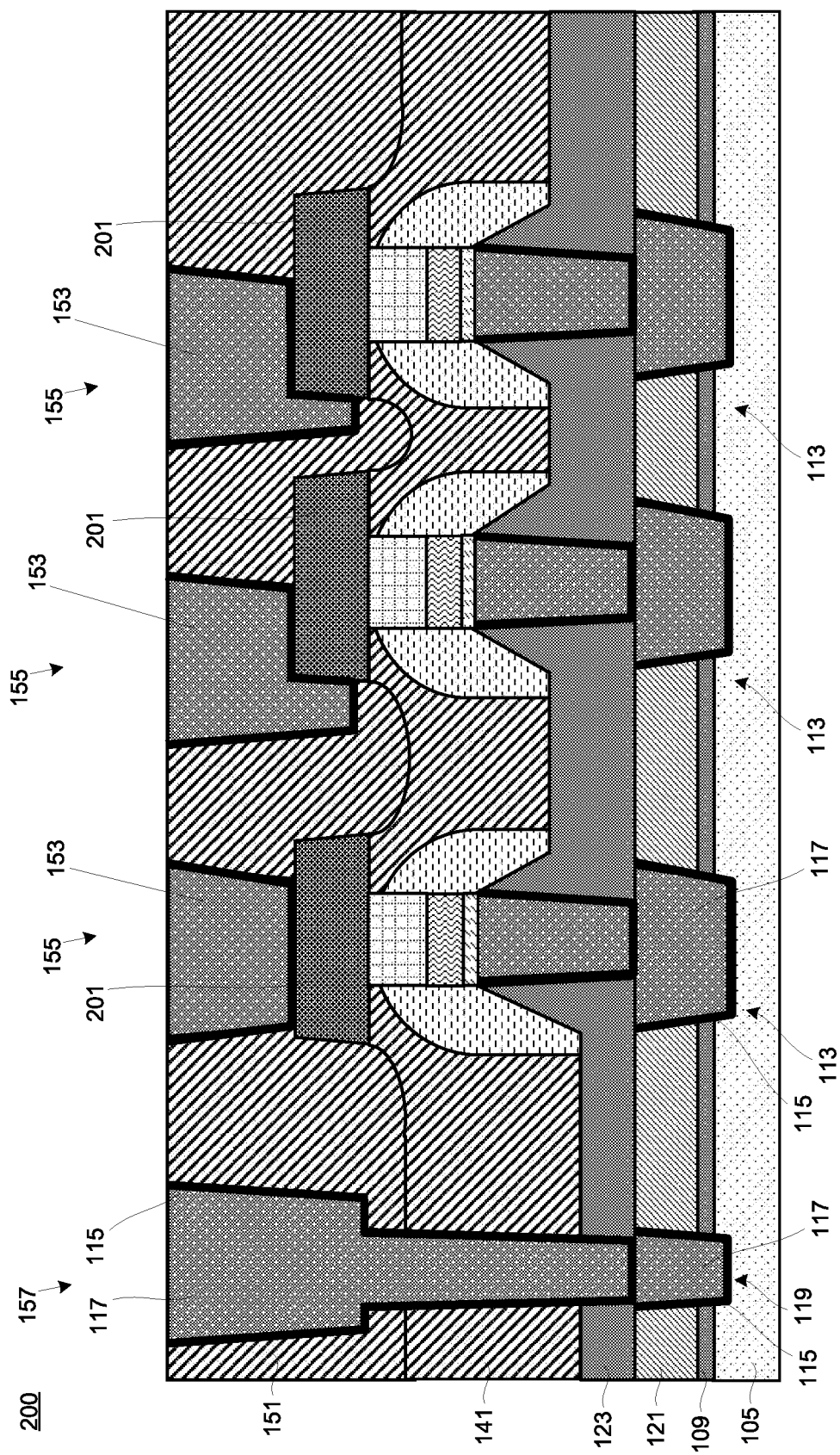
Figure 12:
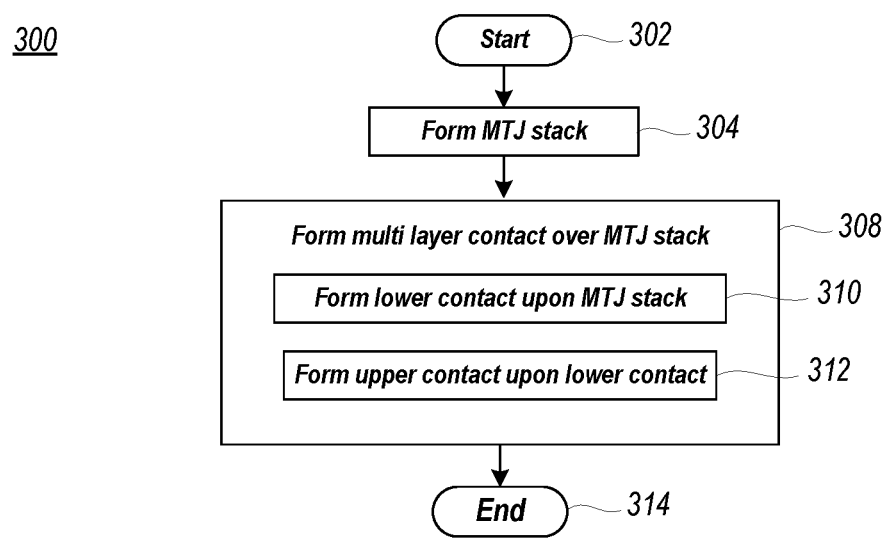
FIG. 12 is a flow diagram illustrating a semiconductor device fabrication method, in accordance with one or more embodiments.

Referring to FIG. 11, upper contact 153 of the dual layer contact 155 is formed in the inter-layer dielectric layer(s) 151 upon and physically connected to the lower contact 143. The upper contact 153 may be a conductive line, via, or other conductive wiring feature, and may be formed using suitable formation methods such as damascene, dual-damascene, deposition, plating, combinations thereof, or the like.

Referring to FIG. 11, logic region contact (s) 157 may also be formed in the inter-layer dielectric layer(s) 141 and in the inter-layer dielectric layer(s) 151 upon and physically connected to conductive feature 119. Logic region contact(s) 157 may be a conductive line, via, or other conductive wiring feature, and may be formed using suitable formation methods such as damascene, dual-damascene, deposition, plating, combinations thereof, or the like. Logic region contact (s) 157 may be formed simultaneously with upper contact 153.

In some embodiments, one or more mask layers (not shown) aid in formation of upper contact 153 openings in the inter-layer dielectric layer(s) 151 and/or logic region contact(s) 157 openings in the inter-layer dielectric layer(s) 141, 151. In some embodiments, the upper contact 153 openings and/or logic region contact(s) 157 openings are formed by a via-first process. In other embodiments, the upper contact 153 openings and/or logic region contact(s) 157 openings are formed by a trench-first process. Subsequently, the upper contact 153 openings and/or logic region contact(s) 157 openings may be filled with suitable conductive material(s).

In some embodiments, upper contact 153 and/or logic region contact 157 openings includes conductive regions 117 and conductive barrier layers 115 lining sidewalls and bottom surfaces of the conductive regions 117. A planarization process, such as CMP process or a mechanical grinding process, may remove excess upper contact 153 material(s) and may planarize the top surface of inter-layer dielectric layer(s) 151, the top surface of upper contact 153, and/or the top surface of logic region contact 157.

In some embodiments, as depicted, upper contact 153 is narrower than the underlying lower contact 201 (e.g., sidewalls of the upper contact 153 are closer together relative to the sidewalls of the underlying associated lower contact 201).

For clarity, semiconductor device 200 includes a dual layer contact 155. The dual layer contact 155 may physically and electrically contact TE 131 of a MTJ stack. The dual layer contact 155 includes lower contact 201 and upper contact 153.

The lower contact 201 opening may be shallower and wider relative to the upper contact 153. The width of the lower contact 201 may be wider than the MTJ stack, may be wider than the encapsulation spacer(s) 133 of the MTJ stack, or the like. The lower contact 201 may be in physical and electrical contact with portion(s) of the top surface, portion(s) of the sidewall(s) of TE 131, etc.

Whereas the lower contact 201 is formed with a subtractive formation process, the upper contact 153 may be formed with a different process, such as a damascene process. In this process, the upper contact 153 opening width may be skinny relative to the lower contact 201 there below. This relatively larger width of the lower contact 201 decreases the propensity for over etching the upper contact 153 opening downward into the MTJ layers 129 of the MTJ stack. Upper contact 153 and logic region contacts 157 may be formed together using damascene process. The upper contact 153 is formed in the upper contact 153 opening and may be in physical and electrical contact with portion(s) of the top surface, portion(s) of the sidewall(s) of the lower contact 201 there below. A less uniform and/or faster etch process can be used in upper contact 153 opening and logic region contacts 157 opening formation, since generous over etch can be added without eroding encapsulation 131 and/or the MTJ stack, which are protected by lower contact 201. Further, due to the width of lower contact 201, the lower contact 201 may further protect the MTJ stack and/or encapsulation 133 even when the upper contact 153 is misaligned to the MTJ stack, as is depicted in FIG. 11. Sidewalls of lower contact 201 may be substantially vertical or sloped, as depicted.

FIG. 17 is a flow diagram illustrating a semiconductor device fabrication method 300, in accordance with one or more embodiments. Method 300 may be utilized to fabricate semiconductor device 100 and/or 200 as appropriate. Method 300 begins at block 302 and may continue with forming a MTJ stack. The MTJ stack may be fabricated in the conjunction of forming a memory (e.g., MRAM) cell.

The MTJ stack may formed by patterning BE layer 127', MTJ layers 129', and the TE 131'. The patterning process forms a MTJ stack which may include a BE 127, formed from a retained portion of the BE layer 127', a MTJ 129, formed from a retained portion of the MTJ layers 129, and a TE 131, formed from a retained portion of the TE 131'. The layers of the MTJ stack may be generally vertically aligned with substantially coplanar sidewalls and may be located upon a conductive feature 125.

In some embodiments, the MTJ stack has sloped sidewalls. In some embodiments, a width of the TE 131 is less than a width of the BE 127. In some embodiments, the MTJ stack has substantially vertical sidewalls.

After MTJ stack formation, various protective layers may be formed on sidewalls and top surfaces of the MTJ stack. In some embodiments, oxide layers may be formed on sidewalls of the MTJ stack. In some embodiments, the oxide layers comprise oxides of metal elements that form the MTJ stack and may be formed using an oxidation process. In some embodiments, the oxide layers prevent electron flow along the sidewalls of the MTJ stack that may adversely affect magnetic performance of the MTJ layers 129. In some embodiment, the oxide layers may have a thickness between about 5 Å and about 15 Å.

In some embodiments, encapsulation spacers 133 may be further formed upon the sidewalls of the MTJ stack. The encapsulation spacers 133 may be formed by forming a passivation layer 133' is over the MTJ stack and upon dielectric layer 123. An etching process, such as a dry etch, may be performed to etch the passivation layer 133' and to expose top portions of the MTJ stack (e.g., top portion(s) and/or top surface of the TE 131). Retained portion(s) of the passivation layer 133' may form encapsulation spacers 133 are located upon the sidewalls of the MTJ stack. In some embodiments, the etching process is an anisotropic etching process and removes horizontal portions of the passivation layer 133'. In some embodiments, one or more inter-layer dielectric layer(s) 141 may be formed upon encapsulation spacer 133 and upon the exposed portion of the MTJ stack. If semiconductor device 100 is desired, the top surface of the one or more inter-layer dielectric layer(s) 141 may be above the top surface of the TE 131 of the MTJ stack. If semiconductor device 200 is desired, the top surface of the one or more inter-layer dielectric layer(s) 141 may be coplanar with the top surface of the TE 131 of the MTJ stack.

Method 300 may continue with forming multilayer or dual layer contact 155 over the MTJ stack (block 308). For example, if semiconductor device 100 is desired, lower contact 143 openings are formed in the portion of the inter-layer dielectric layer(s) 141 between the top surface of the TE 131 and the top surface of the inter-layer dielectric layer(s) 141. The lower contact 143 opening exposes a portion of the TE 131 of the MTJ stack. For example, the lower contact 143 opening exposes the top surface of the TE 131, the lower contact 143 opening exposes the top surface of the TE 131, and a portion of one or more sidewalls of the TE 131, etc. Subsequently, the lower contact 143 may be formed by filling lower contact 143 openings with suitable conductive material(s) (block 310).

For example, if semiconductor device 200 is desired, a lower contact layer 201' may be formed upon the inter-layer dielectric layer(s) 141 and upon the top surface of the TE 131. Subsequently, the lower contact 201 may be formed by removing undesired portions of the lower contact layer 201' and retaining at least a portion of the lower contact layer 201 layer' that is upon and physically connected to the TE 131 (block 310).

In some embodiments, a planarization process, such as CMP process or a mechanical grinding process, may remove excess lower contact 143, 201 material(s) and may planarize the top surface of inter-layer dielectric layer(s) 141 and the top surface of lower contact 143, 201.

In some embodiments, lower contact 143, 201 is wider than the underlying MTJ stack (e.g., sidewalls of the lower contact 143, 201 are outside the sidewalls of the MTJ stack). In alternative embodiments, lower contact 143, 201 is wider than the one or more of the underlying encapsulation spacer(s) 133 (e.g., sidewalls of the lower contact 143, 201 are outside the sidewalls of the encapsulation spacer 133, etc.).

In some embodiments, one or more inter-layer dielectric layer(s) 151 are formed upon the inter-layer dielectric layer(s) 141 and upon the exposed surface portion(s) of lower contact 143, 201.

Method 300 may continue with forming upper contact 153 of the dual layer contact 155 in the inter-layer dielectric layer(s) 151 upon and physically connected to the lower contact 143, 201 (block 312). In some embodiments, logic region contact(s) 157 may also be formed in the inter-layer dielectric layer(s) 141 and in the inter-layer dielectric layer(s) 151 upon and physically connected to conductive feature 119 along with (e.g., simultaneously, etc.) upper contact 153.

Upper contact 153 and logic region contact 157 may be formed by forming upper contact 153 openings in the inter-layer dielectric layer(s) 151 and/or logic region contact(s) 157 openings in the inter-layer dielectric layer(s) 141, 151. In some embodiments, the upper contact 153 openings and/or logic region contact(s) 157 openings are formed by a via-first process. In other embodiments, the upper contact 153 openings and/or logic region contact(s) 157 openings are formed by a trench-first process. Subsequently, the upper contact 153 openings and/or logic region contact(s) 157 openings may be filled with suitable conductive material(s).

In some embodiments, as depicted, upper contact 153 is narrower than the underlying lower contact 143, 201 (e.g., sidewalls of the upper contact 153 closer together relative to the sidewalls of the underlying associated lower contact 143, 201).

The lower contact 201 opening may be shallower and wider relative to the upper contact 153. The width of the lower contact 201 may be wider than the MTJ stack, may be wider than the encapsulation spacer(s) 133 of the MTJ stack, or the like. The lower contact 201 may be in physical and electrical contact with portion(s) of the top surface, portion(s) of the sidewall(s) of TE 131, etc. Method 300 may end at block 314.

Method 300 may be implemented to utilize a generous over etch in the formation of upper contact 153 opening since the MTJ stack is protected by the lower contact 143, 201. Even when the generous over etch is implemented, the protection of the MTJ stack by the lower contact 143, 201 decreases the propensity for over etching the upper contact 153 opening downward into the MTJ layers 129 of the MTJ stack. Further, due to the larger width of lower contact 143, 201, the lower contact may further protect the MTJ stack even when the upper contact 153 is misaligned to the MTJ stack.

The method flow diagrams depicted herein are exemplary. There can be many variations to the diagrams or operations described therein without departing from the spirit of the embodiments. For instance, the operations can be performed in a differing order, or operations can be added, deleted or modified. All of these variations are considered a part of applicable claimed embodiments.

The descriptions of the various embodiments of the present invention have been presented for purposes of illustration but are not intended to be exhaustive or limited to the embodiments described. Many modifications and variations will be apparent to those of ordinary skill in the art without departing from the scope and spirit of the invention. The terminology used herein was chosen to best explain the principles of the embodiment, the practical application or technical improvement over technologies found in the marketplace, or to enable others of ordinary skill in the art to understand the embodiments described herein.

What is claimed is:

1. A semiconductor device comprising:
   a magnetic tunnel junction stack comprising a bottom electrode, magnetic tunnel junction layers upon the bottom electrode, and a top electrode upon the magnetic tunnel junction layers;
   a dual layer contact upon the magnetic tunnel junction stack, the dual layer contact comprising a conductive lower contact in physical contact with the top electrode and a conductive upper contact in physical contact with at least a portion of a top surface of the conductive lower contact, wherein the conductive lower contact is wider than the conductive upper contact; and
   a first interlayer dielectric (ILD) in physical contact with an outer sidewall of the conductive lower contact and in physical contact with a bottom surface of the conductive lower contact, wherein the top surface of the conductive lower contact is coplanar with a top surface of the first ILD.

2. The semiconductor device of claim 1, wherein the conductive lower contact is shallower than the conductive upper contact.

3. The semiconductor device of claim 2, further comprising:
   an encapsulation spacer in physical contact with sidewalls of the magnetic tunnel junction stack;
   wherein the conductive lower contact is wider than the encapsulation spacer; and
   wherein the first ILD is in physical contact with the encapsulation spacer.

4. The semiconductor device of claim 2, further comprising:
   an encapsulation spacer in physical contact with sidewalls of the magnetic tunnel junction stack;
   wherein a lateral width of the conductive lower contact is less than a lateral width of the encapsulation spacer and greater than a lateral width of the magnetic tunnel junction stack; and
   wherein the first ILD is in physical contact with the encapsulation spacer.

5. The semiconductor device of claim 2, wherein the conductive upper contact is wider than the magnetic tunnel junction stack.

6. The semiconductor device of claim 2, wherein a portion of the conductive upper contact physically contacts the outer sidewall of the lower contact.

7. The semiconductor device of claim 2, wherein the conductive lower contact comprises a top surface, a bottom surface, and outwardly sloped sidewalls that share a bisector line of symmetry.

8. The semiconductor device of claim 7, wherein the conductive upper contact comprises outwardly sloped sidewalls.

9. The semiconductor device of claim 1, further comprising:
a second ILD in physical contact with at least an outer sidewall of the conductive upper contact and in physical contact with a top surface of the conductive lower contact.

10. The semiconductor device of claim 9, wherein the second ILD is in physical contact with the top surface of the first ILD.

11. The semiconductor device of claim 9, wherein the second ILD is composed of a same dielectric material relative to the first ILD.

12. A semiconductor device comprising:
a magnetic tunnel junction stack comprising a bottom electrode, magnetic tunnel junction layers upon the bottom electrode, and a top electrode upon the magnetic tunnel junction layers;
a dual layer contact upon the magnetic tunnel junction stack, the dual layer contact comprising a conductive lower contact in physical contact with the top electrode and a conductive upper contact in physical contact with at least a portion of a top surface of the conductive lower contact, wherein the conductive lower contact comprises outwardly sloped sidewalls and is wider than the conductive upper contact and is wider than the magnetic tunnel junction stack; and
a first interlayer dielectric (ILD) in physical contact with an outer sidewall of the conductive lower contact and in physical contact with a bottom surface of the conductive lower contact, wherein the top surface of the conductive lower contact is coplanar with a top surface of the first ILD.

13. The semiconductor device of claim 12, wherein the conductive lower contact is shallower than the conductive upper contact.

14. The semiconductor device of claim 13, further comprising:
an encapsulation spacer in physical contact with sidewalls of the magnetic tunnel junction stack;
wherein the conductive lower contact is wider than the encapsulation spacer; and
wherein the first ILD is in physical contact with the encapsulation spacer.

15. The semiconductor device of claim 13, further comprising:
an encapsulation spacer in physical contact with sidewalls of the magnetic tunnel junction stack;
wherein a lateral width of the conductive lower contact is less than a lateral width of the encapsulation spacer and greater than a lateral width of the magnetic tunnel junction stack; and
wherein the first ILD is in physical contact with the encapsulation spacer.

16. The semiconductor device of claim 13, wherein the conductive upper contact is wider than the MTJ magnetic tunnel junction stack.

17. The semiconductor device of claim 13, wherein a portion of the conductive upper contact physically contacts the outer sidewall of the lower contact.

18. The semiconductor device of claim 13, wherein the conductive upper contact comprises outwardly sloped sidewalls.

* * * * *